United States Patent
Ismail et al.

(10) Patent No.: US 7,493,097 B2
(45) Date of Patent: Feb. 17, 2009

(54) HIGH DYNAMIC RANGE COMPACT MIXER OUTPUT STAGE FOR A WIRELESS RECEIVER

(75) Inventors: Aly M. Ismail, Newport Beach, CA (US); Geoffrey Hatcher, Costa Mesa, CA (US); Edward Youssoufian, Irvine, CA (US); Dave Yates, San Clemente, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 355 days.

(21) Appl. No.: 11/177,102

(22) Filed: Jul. 7, 2005

(65) Prior Publication Data

US 2007/0010230 A1 Jan. 11, 2007

(51) Int. Cl.
*H04B 1/10* (2006.01)
*H04B 1/18* (2006.01)

(52) U.S. Cl. .................. 455/285; 455/302; 455/313

(58) Field of Classification Search ............... 455/285, 455/302, 313, 326, 283, 284, 304, 305, 165.1; 327/358, 359
See application file for complete search history.

(56) References Cited

U.S. PATENT DOCUMENTS

| 4,162,452 | A | 7/1979 | Ash |
| 4,896,122 | A | 1/1990 | Tahernia et al. |
| 5,444,415 | A | 8/1995 | Dent et al. |
| 5,450,044 | A | 9/1995 | Hulick |
| 5,452,290 | A | 9/1995 | Mihm, Jr. |
| 5,535,247 | A | 7/1996 | Gailus et al. |
| 5,553,319 | A | 9/1996 | Tanbakuchi |
| 5,557,641 | A | 9/1996 | Weinberg |
| 6,101,224 | A | 8/2000 | Lindoff et al. |
| 6,114,913 | A * | 9/2000 | Entrikin ................ 330/308 |
| 6,194,963 | B1 | 2/2001 | Camp, Jr. et al. |
| 6,763,228 | B2 * | 7/2004 | Prentice et al. ........ 455/127.2 |
| 6,771,132 | B1 * | 8/2004 | Denoyer et al. ............ 330/308 |
| 6,819,182 | B2 | 11/2004 | Sibrai |
| 7,039,382 | B2 * | 5/2006 | Shu ........................... 455/313 |
| 7,062,248 | B2 * | 6/2006 | Kuiri ......................... 455/334 |
| 7,202,741 | B2 * | 4/2007 | Park et al. .................. 330/254 |
| 2002/0039894 | A1 | 4/2002 | Yoshida et al. |
| 2004/0142674 | A1 | 7/2004 | Kuiri |

FOREIGN PATENT DOCUMENTS

| EP | 0800267 | 8/1997 |
| GB | 2235855 | 3/1991 |
| JP | 06-338793 | 12/1994 |

* cited by examiner

*Primary Examiner*—Sonny Trinh
(74) *Attorney, Agent, or Firm*—Weide & Miller, Ltd.

(57) ABSTRACT

A mixer is disclosed having an output stage with an amplifier or gain device configured in a feedback loop to maintain a virtual ground at the input to the gain device. The gain device provides significant dynamic range, gain, and the appropriate impedance matching to insure a low noise output signal of a desired magnitude. Use of an amplifying output stage removes the dependence between mixer gain and mixer configuration, such as mixer bias resistor value, while concurrently overcome undesirable flicker noise that results from use of active devices in the mixer bias structure. A stable virtual ground at the mixer output and gain device input provides linearity over frequency. The gain device may comprises an operational amplifier or trans-resistance/trans-conductance device.

20 Claims, 6 Drawing Sheets

Example Environment

HIGH DYNAMIC RANGE COMPACT MIXER OUTPUT STAGE FOR A WIRELESS RECEIVER

FIELD OF THE INVENTION

The invention relates to communication devices and, in particular, to a mixer output stage.

RELATED ART

Numerous modern communications devices often utilize wireless channels to exchange information, such as for voice or data communication. As is generally understood, each communications standard is assigned a block of frequency bandwidth to share between devices operating under that standard and within that block of frequency bandwidth. For example, FM radio, cellular, GPS, and cordless telephones are all assigned and operate within a different block of bandwidth.

Numerous methods of utilizing this assigned bandwidth have been developed and are currently in use. In the case of wireless communications, numerous wireless devices often share the bandwidth allocated to that standard or system, either through frequency assignment or codes based on frequency hopping. Because numerous wireless devices may be operating in close proximity, one common characteristic of all such devices is the need to tune the transceiver to one or more particular frequencies so that the desired signal may be isolated from other signals within the shared frequency bandwidth.

One system often utilized to perform this task is a mixer within a communication device receiver. Wireless receivers were traditionally built in a super heterodyne configuration, but due to cost and space efficiency, modern communication device receivers are often configured as a direct conversion receiver. In a direct conversion receiver, the modulated signal is down converted directly to baseband in a single stage, whereas in a super heterodyne configuration the receiver converts the signal to an intermediate frequency before demodulation to baseband.

To down-convert the signal in a direct conversion receiver, a mixer in connection with a local oscillator is used to isolate the desired baseband signal. It is often necessary or desirable to establish enough signal gain at the mixer output to provide a signal of desired magnitude and power to down-stream processing elements. One problem that plagues prior art mixer designs is that as the gain increases, the prior art mixers introduce an undesirably large amount of noise or non-linearity. As a result, prior art designs did not meet specification, or were undesirably complex to implement.

Various solutions have been proposed to overcome these drawbacks but these solutions introduce additional noise, such as flicker noise, or increase current consumption, or both. Disclosed herein is a method and apparatus for overcoming the drawbacks in the prior art by providing a highly accurate, low noise, lower power consumption, wide dynamic range, compact mixer output stage.

SUMMARY

To overcome the drawbacks of the prior art and provide additional benefits as described herein, a mixer is disclosed that is configured to amplify the mixer output signal, i.e wanted signal, without introducing unwanted noise, increasing current consumption, or clipping and distorting the output signal. In general, a mixer output stage is configured with a virtual ground at the mixer output to thereby de-couple the level of gain from the mixer configuration and establish output linearity over the range of output frequencies. A trans-conductance amplifier may comprise part of the output stage to provide a wide dynamic range and maintain the virtual ground.

In one embodiment, a mixer is disclosed having a first input configured to receive a local oscillator signal and a second input configured to receive a high frequency input. The inputs connect to a mixer core configured to receive the local oscillator signal and the high frequency input to create a mixer output, which is provided as a mixer output on an output stage. The output stage comprises at least one amplifier having an amplifier input node configured to receive the mixer output and generate an amplifier output at an amplifier output node. The amplifier may increase the magnitude of the signal. In addition, there is at least one feedback path connected to the amplifier output node and the amplifier input node such that the amplifier and at least one feedback path are configured to establish a virtual ground at the amplifier input node.

It is contemplated that the amplifier may comprise an operational amplifier or a trans-conductance device. In addition, the feedback path may comprises an interconnection conductor, a capacitor, a resistor, or any combination of these elements. In one embodiment the mixer core is biased through a load resistor, and the gain of mixer is not dependent on the value of the load resistor. This de-couples the mixer gain from the mixer configuration thereby eliminating non-linearities due to variance in resistor values. It is further contemplated that the amplifier may comprise an inverting differential amplifier having positive and negative input terminals and positive and negative output terminals.

Also disclosed herein is a mixer output stage that may be integrated with or coupled to a mixer. In one embodiment the output stage comprises a positive input connected to gain device and a negative input connected to the gain device. The gain device may comprise any device that increases the magnitude of the signal or may be configured with unity gain. The gain device may be configured to receive and process a mixer core output signal to generate a processed version of the mixer core output. In this embodiment the gain device is configured with a positive output terminal and a negative output terminal. Also part of this embodiment is a first feedback loop connected to the positive input and the negative output terminal and a second feedback loop connected to the negative input and the positive output terminal. The first and second feedback loop may be configured with at least one resistive element. In this configuration, the mixer output stage is configured to establish a virtual ground at the positive input and the negative input for at least certain frequencies. This results in a low noise gain stage that does not clip the input signal nor result in non-linearity over frequency of the output.

In one configuration, the gain device comprises a trans-impedance device or a trans-resistance device. In addition, this system may further comprise a first capacitor in parallel with the first feedback loop and a second capacitor in parallel with the second feedback loop. In one embodiment, the positive input and the negative input may comprise a virtual ground for all input frequencies. As a benefit to this configuration, the gain of the mixer and output stage is not dependent on the mixer configuration.

Also disclosed herein is a method for converting a received high frequency signal to baseband frequency signal or an intermediate frequency signal while providing a desired level of mixer gain. In one embodiment, this method comprises receiving a high frequency signal and receiving a local oscillator signal. The method then processes the high frequency signal and the local oscillator signal in a mixer to generate a processed signal. The processed signal, or a signal related to the processed signal, is provided to an amplifier input and amplified to create an amplified signal. Accordingly, the method also generates a feedback signal based on the amplified signal and provides the feedback signal to the amplifier input to thereby maintain a virtual ground at the amplifier input.

In this method, the amplifier may comprise a trans-impedance device or an operational amplifier. Using this method, the gain level of the mixer or output stage may be set independent of the mixer configuration, and in particular, the mixer bias resistor values. In the embodiment described above, the feedback signal is generated in a first feedback loop and a second feedback loop. The feedback loops may maintain a virtual ground, which in turn maintains mixer linearity. In one embodiment, the step of processing the high frequency signal and the local oscillator signal in a mixer to generate a processed signal comprises signal multiplication, although any method or process may be utilized.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

Figure 1:
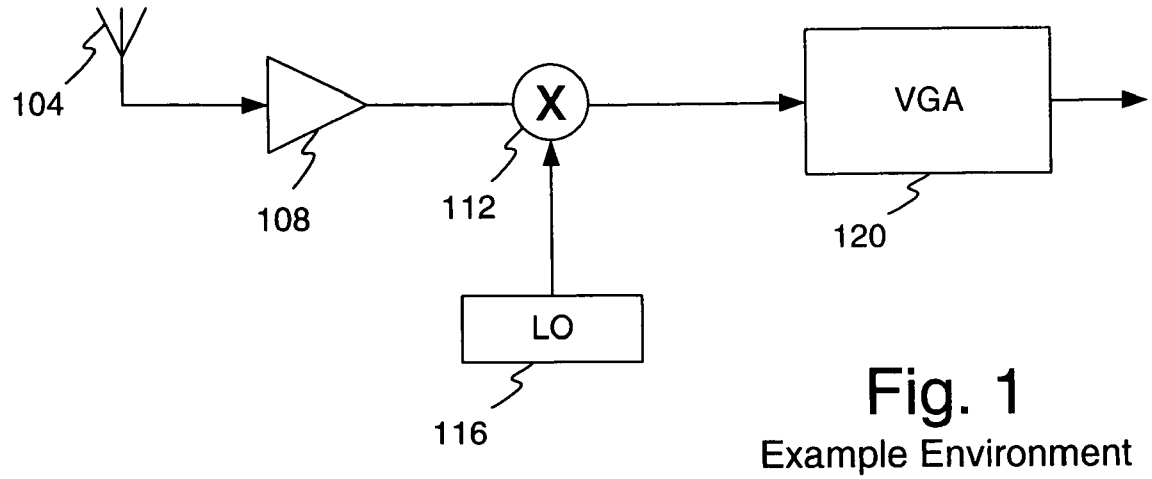
FIG. 1 illustrates an example environment of use of the method and apparatus disclosed herein.

FIG. 1 illustrates an example environment of use of the method and apparatus disclosed herein. This is but one possible example environment of use and as such, it is contemplated that one of ordinary skill in the art may arrive at other environments that will benefit from these principles and that such other environments of use would also be covered by the claims. As shown, an antenna 104 connects to a low noise amplifier (LNA) 108, which in turn connects to a down conversion mixer 112. The mixer 112 receives a local oscillator signal from a local oscillator 116. The output of the mixer 112 feeds into a filter and variable gain amplifier module and optional filter 120. The output of the VGA module 120 may be provided to a baseband processing module, not shown, for additional processing as would be understood by one of ordinary skill in the art.

In operation the antenna 104 receives one or more signals over a wireless channel. Although tuned for a particular frequency range, the received signals comprise the desired signals and one or more blockers. These signals are provided to the LNA 108, which amplifies the received signals to a power level suitable for processing. The mixer 112 multiplies the received signal with the local oscillator signal, which in this direct conversion receiver is at the frequency of the desired signal. The output of the mixer 112 is the desired signal at baseband, which may be further filtered by the module 120 to more accurately isolate the desired signal. A variable gain amplifier, also part of the module 120, increases or decreases the magnitude of the desired signal to a level suitable for supplemental processing. It is contemplated that the principles disclosed herein may be utilized in a direct conversion receiver as shown, in a super heterodyne receiver, or in any other embodiment or system.

Figure 2:
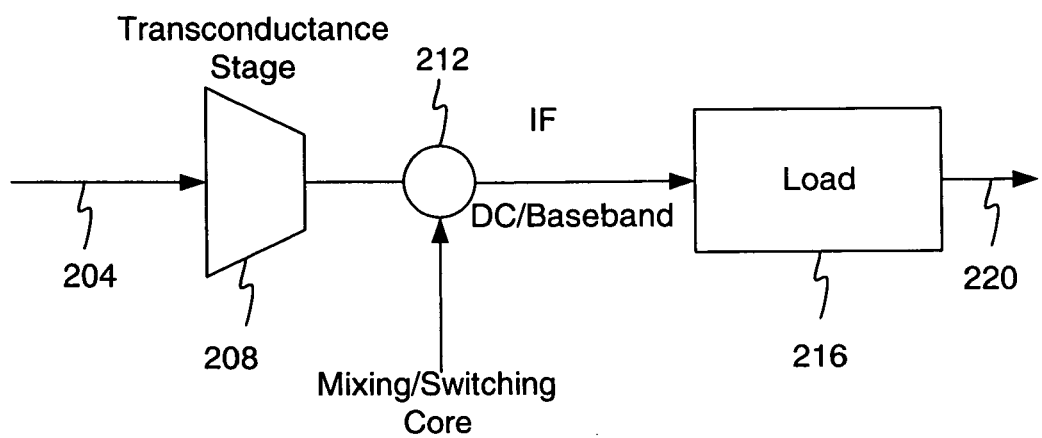
FIG. 2 illustrates a block diagram of an exemplary mixer.

FIG. 2 illustrates a block diagram of an exemplary mixer. As shown, a trans-conductance stage 208 receives an input signal on input 204, such as an RF input. The trans-conductance stage 208 comprises an amplifier having a voltage input and a current output. The output of the trans-conductance stage 208 is provided to a mixer/switching core 212, which may down-convert the current signal, in a direct conversion receiver, to baseband, or an intermediate frequency for a super heterodyne receiver. The core 212 also receives the local oscillator signal.

The output of the mixer core 212 feeds into a load 216. The load 216 may comprise any type load. In one embodiment, the load 216 is tuned to the intermediate frequency. In one embodiment, the load is tuned for low frequency response. In one embodiment, the load 216 comprises a resistance and capacitance. The load 216 may be configured to convert the current signal back to a voltage signal. Thus, the signal on the output 220 may comprise either a voltage signal or a current signal. This is but one possible mixer configuration and it is contemplated that one of ordinary skill in the art may arrive at different mixer configurations.

Figure 3:
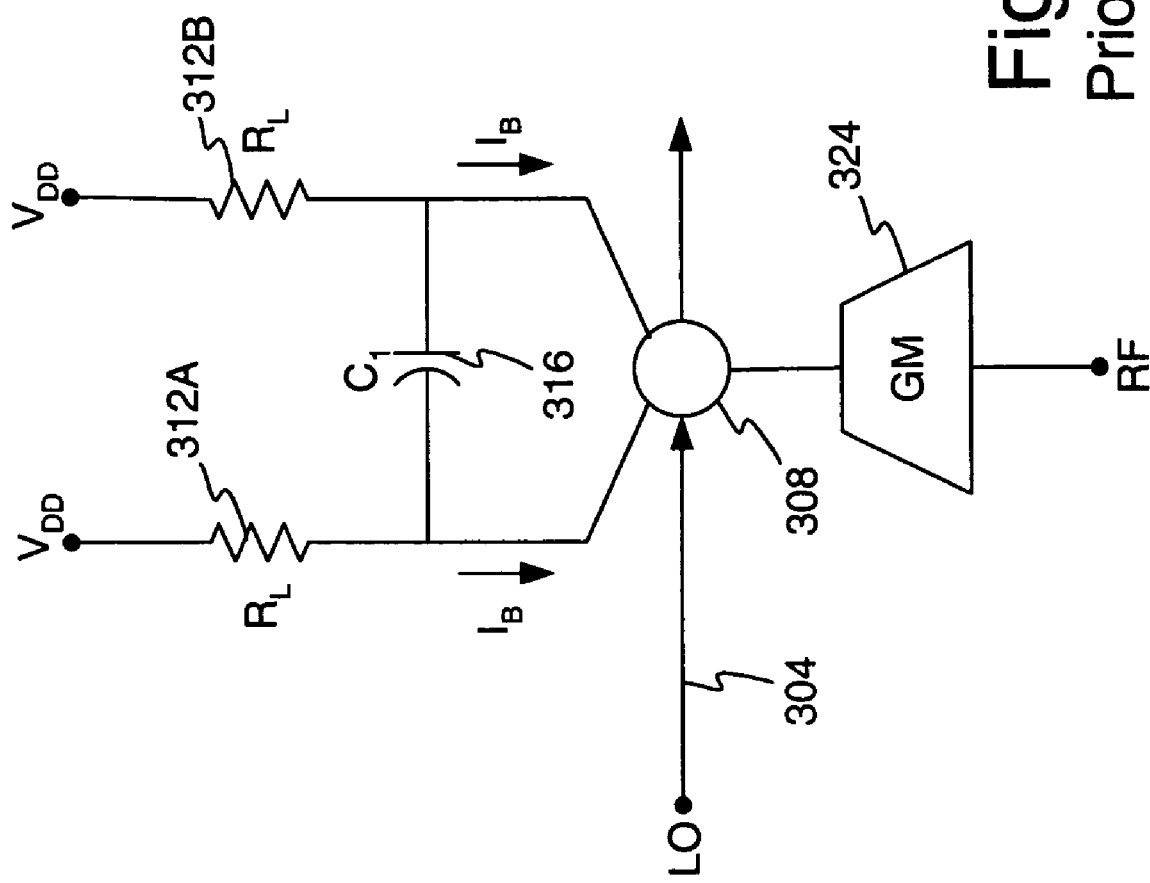
FIG. 3 illustrates a block diagram of an example implementation of a prior art mixer.

FIG. 3 illustrates a block diagram of an example implementation of a prior art mixer. In this prior art embodiment, a local oscillator input 304 is provided to a mixer core 308. The mixer core 308 also receives as an input current $I_B$ which is received through resistors 312A, 312B (collectively 312). These resistors 312 connect in series to a voltage source $V_{DD}$. The current $I_B$ comprises or represents the bias current. The resistors 312 may be the same value or different values. In this embodiment the resistors have values $R_L$. A capacitor $C_1$ 316 is connected to the mixer core node of the resistors 312 as shown. Any capacitance value may be utilized.

Another input of the mixer core 308 connects to a transconductance stage (GM) 324, which in turn connects to the RF (radio frequency) input, which may be configured to accept the received signal.

In operation, the received RF signal is provided to the GM 324, which amplifies the received signal, and may convert the signal to a current for processing by the mixing core. A local oscillator signal at a signal that matches the frequency of the signal to be isolated, referred to herein as the desired frequency, is also provided to mixer core 308 via input 304. The mixer core 308 also receives or is biased by the bias current signals $I_B$ through resistors 312A and 312B as shown. The output from the mixer core comprises the desired signal from the composite of signals that comprise the received signal. It is contemplated that a blocker signal, which comprises an unwanted or undesired signal, may also be output.

As way of background, the mixer conversion gain is defined by Ap, which is the level of gain applied to the signal as the signal is processed by a mixer. Gain may be defined generally as an increase in magnitude. To achieve the desired and optimal output signal level, the mixer is configured with adequate gain. However, in prior art embodiments, this may present a challenge. In particular, gain Ap is provided as:

$$Ap = Gm \times \left(\frac{2}{\pi}\right) \times R_L$$

Where Gm is given and generally fixed for the GM device 324 and $R_L$ comprises the resistor 312 value. Thus, to increase the gain of the mixer, the value of $R_L$ may be increased to generate a signal magnitude that is large enough such that the subsequent processing elements (for example, element 120, FIG. 1) receive a signal that is of sufficient magnitude for processing and that exceeds the noise threshold or noise floor of the system.

Raising the value of $R_L$ to increase gain is not however, without drawbacks. The bias current is generally fixed and by raising $R_L$ increases the voltage drop across the resistor $R_L$. This in turn lowers the voltage headroom across the mixer core 308. As a result, for a given bias current, increasing $R_L$ increases the voltage drop across the resistors $R_L$, which in turn reduces the mixer headroom. This is undesirable because it results in clipping and non-linearity of the output signal. To avoid clipping the DC voltage or headroom for the mixer must be reduced and thus the acceptable voltage swing of the input signal, the output signal, or both, is reduced. As a result, increasing $R_L$ is not a viable option.

To overcome these drawbacks, one solution is to replace the pull-up resistors 312 $R_L$ with transistors, such as PFETs, but this structure results in increased current consumption by the PFETs and the PFETs contribute noise to the signal, in particular flicker noise. As a result, this solution is also undesirable.

Figure 4:
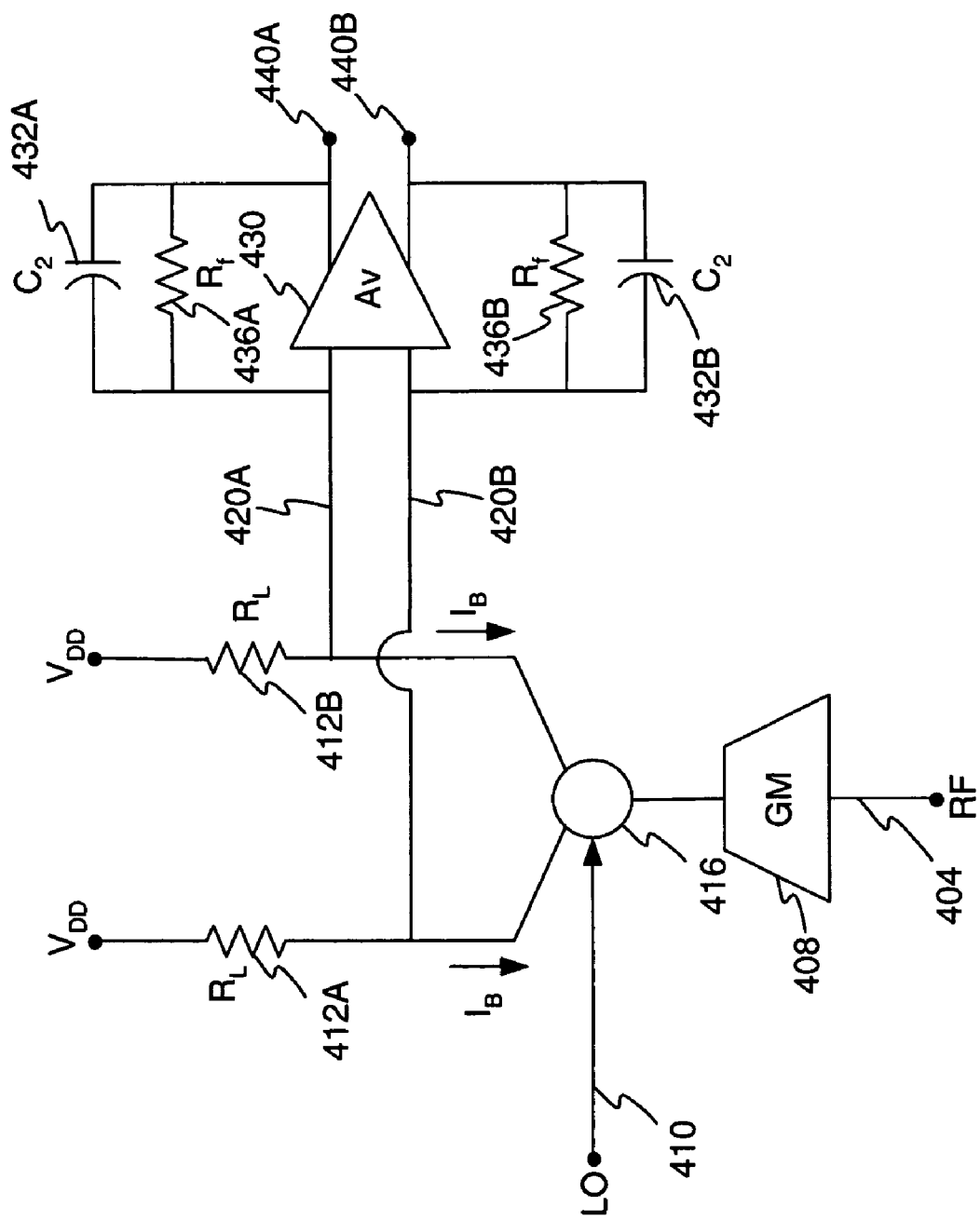
FIG. 4 illustrates an example embodiment of a mixer output stage.

FIG. 4 illustrates an example embodiment of a mixer output stage as described herein. In this example embodiment, a local oscillator input 410 connects to a mixer core 416.

The mixer core 416 also receives as an input or biasing current $I_B$, which is received through resistors 412A, 412B (collectively 412), which connect in series to a voltage source $V_{DD}$. The current $I_B$ comprises or represents the bias current. The resistors 412 may be the same value or different values. In this embodiment the resistors 412 have values $R_L$.

Another input of the mixer core 416 connects to a transconductance stage (GM) 408, which in turn connects to the RF input 404, which may be configured to accept the received signal.

In operation of the components, the received (RF) radio frequency signal is provided to the GM 408, which amplifies the received signal and may convert the signal to a current for processing by the mixing core 416. A local oscillator signal, on input 410, is presented to the core 416. The LO signal comprises a signal that matches the frequency of the signal to be isolated, referred to herein as the desired signal at the desired frequency or a signal at an intermediate frequency. The mixer core 416 also receives the bias current signals $I_B$ through resistors 412A and 412B as shown.

In this example embodiment, an amplifier 430 connects to the mixer core 416 via nodes 420A and 420B as shown. The amplifier 430 may comprise any device configured to convert a current signal input to a voltage signal and may optionally have gain associated therewith. In one embodiment, the amplifier 430 comprises an operational amplifier. In other embodiments, the amplifier may comprise any type current to voltage amplifier. In this embodiment, node 420A comprises a positive input terminal to the amplifier 430 while node 420B comprises a negative input node of the amplifier. The amplifier 430 may be configured as an inverting amplifier. The amplifier has outputs 440A and 440B.

A feedback resistor $R_f$ 436A and feedback capacitor $C_2$ 432A connect in parallel between node 420A and the output 440A. Likewise, a feedback resistor $R_f$ 436B and feedback capacitor $C_2$ 432B connect in parallel between node 420B and the output 440B. The values of $R_f$ and $C_2$ may comprise any values as would be understood by one of ordinary skill in the art. The capacitors 432 define the pole locations and may perform a filtering function.

As an advantage of this embodiment over prior art embodiments, the value of resistor $R_L$ does not control the level of gain and as such, it is not necessary to increase $R_L$ to increase gain to a desired magnitude. Consequently, the mixer core headroom is not limited and clipping does not occur even as gain is increased.

Instead, gain of the amplifier 430 is controlled at least in part by the resistor values for resistor $R_f$ 436. The following equations provide the mixer conversion gain, which is defined as Ap. The mixer conversion gain is the level or magnitude of gain applied to the signal as the signal is processed by the mixer. Gain may be defined generally as an increase in magnitude. To achieve desired and optimal signal power level, adequate gain is provided by the mixer. Gain $A_p$ is provided by:

$$Ap = Gm \times \left(\frac{2}{\pi}\right) \times R_f$$

where Gm represents a given value for the transconductance device 408 and is given and generally fixed for the GM device. $R_f$ comprises the resistor value for resistor $R_f$ 436. Thus, increasing the value of $R_f$ will increase mixer gain. This provides the benefit that the output signal, from the mixer, is sufficiently large so that the next processing elements (element 120, FIG. 1) will receive a signal that is of sufficient magnitude to exceed the noise threshold or noise floor. This overcomes the drawbacks of the prior art by breaking the link between mixer gain and the value of $R_L$, which if $R_L$ is set to high, results in clipping and non-linearity of the mixer output. Through use of the amplifier 430, the gain may be achieved without affecting linearity and gain is dependent and controllable based on $R_f$. In addition, the amplifier 430 may be selected with a linear gain level and configured ass a low noise device.

The amplifier 430 may also be configured with ample dynamic range. In the case of blocking signals, the signal swing is generally dominated by the blocking signal and thus, the large dynamic range provided by the amplifier 430 allows for the entire signal, namely the desired signal and any blockers, to be output from the mixer without clipping or distortion. In one embodiment, the blocker comprises an unwanted interferer that may pass through the mixer because it is at a frequency that is in close proximity to the desired signal. Supplemental filtering may eliminate the blocker. In some instances the blocker may be larger than or of greater magnitude than the desired signal.

In operation, the embodiment of FIG. 4 receives an RF signal at input 404. The GM stage 408 converts the input to a current signal, which is provided to the mixer core 416. The mixer core 416 processes the signal with the LO signal from input 410 thereby drawing the biasing current $I_B$ through resistors 412 as shown. Nodes 420 appear as virtual grounds thereby causing current to flow through the pull-up resistors 412 and into the operational amplifier 430 via nodes 420. The virtual ground results from the feedback of the amplifier 430 and the loop gain. The current is converted to a voltage at the output 440 of the amplifier 430 and the output gain of the amplifier 430 is controlled at least in part by the value of the feedback resistor $R_f$.

This configuration has numerous advantages over prior art embodiments. One such advantage is that as compared to use of FET in place of the pull-up resistors, the use of pull up resistors $R_L$ 412 eliminates the introduction of flicker noise into the signal and the resistors do not consume current as would a configuration having one or more FETs in place of the resistors $R_L$. In addition, this configuration utilizes an operational amplifier, or other amplifier device 430, which is capable of sufficient headroom, such as for example, rail to rail swings. This provides for substantial gain, if so desired. Additional advantages and benefits are discussed below.

Figure 5:
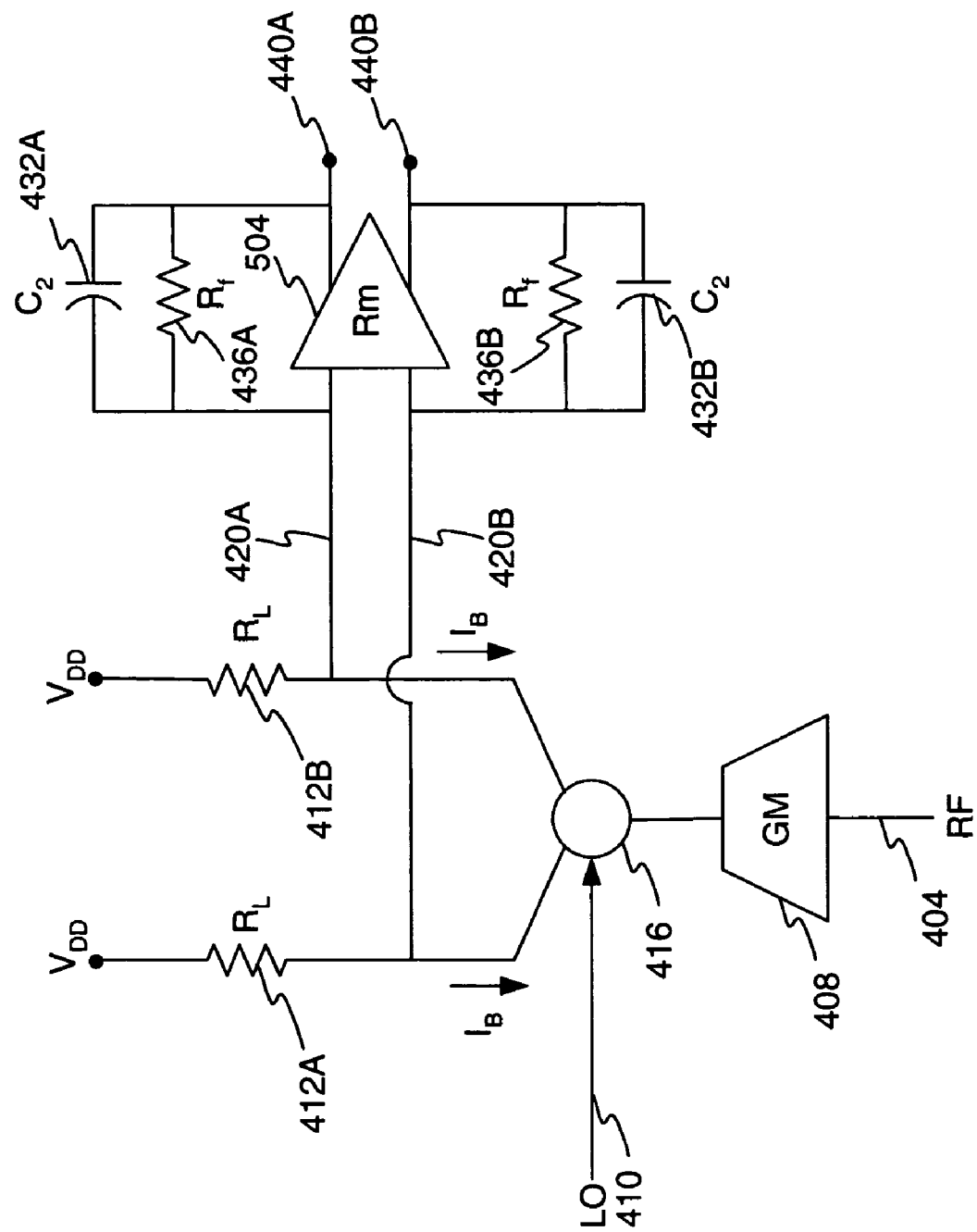
FIG. 5 illustrates an example embodiment of the mixer output as shown in FIG. 4 configured with a tans-impedance amplifier.

FIG. 5 illustrates an example embodiment of the mixer output stage as shown in FIG. 4 configured with a trans-impedance amplifier. This embodiment, as with the embodiments shown in FIGS. 4 and 7 may optionally be implemented as part of the mixer or in a subsequent stage. As compared to FIG. 4, identical or similar elements are referenced with identical reference numbers. It is contemplated that a similar configuration may be utilized that does not depart from the scope of this figure, or that the values of the various components may change. In contrast to the embodiment of FIG. 4, this example embodiment replaces the amplifier 430 with a trans-impedance amplifier 504 configured to generate an output signal that comprises a current signal. Thus, the trans-impedance amplifier 504 serves as a current amplifier which may have gain. The trans-impedance amplifier 504 may comprise a trans-resistance type amplifier.

The configuration of FIG. 5 provides the benefit over the embodiment shown in FIG. 4 of maintaining the desired virtual ground at nodes 420. The virtual ground exists when there is sufficient gain at the amplifier 420. This is achieved by setting $R_L$ to a low value and $R_f$ to a high value. But, the loop gain of the operational amplifier is provided as:

$$\text{gain} = Av \frac{R_L}{(R_L + R_f)}$$

This relationship may also be referred to as the operational amplifier loop gain. Because the values of $R_L$ are low value and $R_f$ is a high value, then the loop gain is defined by a very small value, created by having a small value in the numerator of the equation, namely value $R_L$. If these resistance values deviate from specification or change with temperature or over time, then the gain may change or non-linearities may occur. Although the resistors value deviation may be small, the gain relationship may vary widely and linearity may suffer because the amount of gain may be different than specified by a large percentage.

In addition, at high frequency, the loop gain may be insufficient to maintain the virtual ground at nodes 420. As a result, larger signals at high frequency will experience larger amounts of swing at node 420 which in turn will degrade operation of the mixer. These problems arise directly from the loop gain and virtual ground issues due to the loop gain relationship.

The embodiment of FIG. 5 overcomes these issues through use of a trans-impedance type amplifier 504. Use of a trans-impedance type amplifier 504 for the same or given design consideration, such as fixed values for $R_L$ and $R_f$, maintains the loop gain regardless of the value of $R_L$ even if $R_L$ is small. In this embodiment the loop gain is provided as follows:

$$\text{loop\_gain} = Rm \times \frac{1}{R_f}$$

As can be appreciated, the loop gain is no longer dependent on the value of $R_L$ and as such, low $R_L$ values, which may be desired for optimal mixer headroom, do not reduce loop gain. As a result, the virtual ground at nodes 420 is maintained.

In the embodiment of FIG. 4 the input to the amplifier 430 is a current value and the output of the loop is a voltage value. The output of the amplifier 430 is fed back to node 420 and through a divider $R_f$ and $R_L$. This divider is dependent on the value of $R_L$, and hence, $R_L$ affects loop gain.

In contrast, with the amplifier 504, the feedback signal does not depend on the value of $R_L$, only on the resistance $R_f$ and the resistance of trans-impedance device. Thus, the loop gain is maintained at a high level or at desired level for all frequencies and a large dynamic range is thus provided.

Figure 6A:
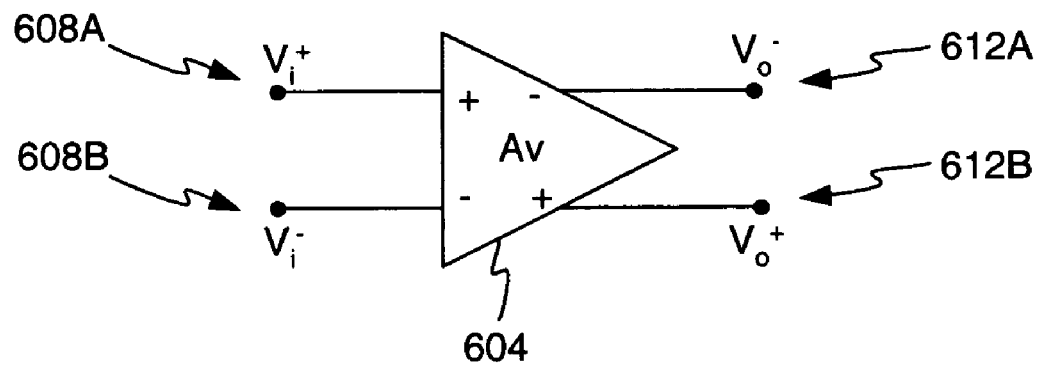
FIGS. 6A and 6B illustrate exemplary amplifier devices.
Figure 6B:
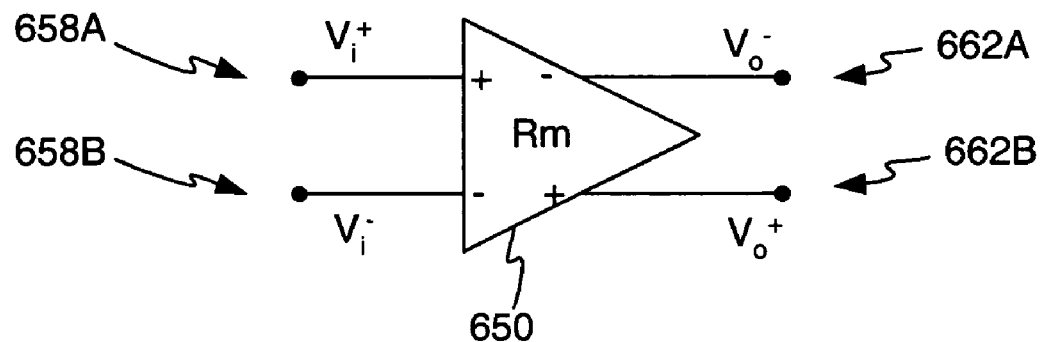

FIGS. 6A and 6B illustrate exemplary amplifier devices. The device shown in FIG. 6A comprises a voltage amplifier configured to receive a current signal input and generate a voltage value output. In contrast, the device shown in FIG. 6B comprises a current amplifier configured to receive a current signal input and generate a current signal output.

In reference to FIG. 6A, the voltage amplifier 604 has inputs 608A, 608B and outputs 612A and 612B and is configured to generate a voltage signal as its output. In this embodiment the input to output relationship of the device 604 is provided as follows:

$$V_o^+ - V_o^- = Av(V_i^+ - V_i^-)$$

and $$R_i^+ \text{ and } R_i^- = \infty$$

This shows that the input resistance of the positive and negative inputs 608A, 608B comprises a large resistance. Further, if a negative feedback is applied across the voltage amplifier when the circuit is open loop, i.e. without feedback, then the resistance of the input node is ideally seen as infinity. But because the amount of gain is so large, it actually appears as a low impedance. If the loop gain decreases then at high frequency the impedance increases and the virtual ground disappears. As described above, this is generally undesirable, although it may function.

In contrast, the device 650 shown in FIG. 6B comprises a current amplifier configured with inputs 658A, 658B and outputs 662A, 662B. The amplifier 650 generates a current signal as its output. The following equations, in this example embodiment, provides for its operation.

$$V_o^+ - V_o^- = Gm(I_i^+ - I_i^-)$$

and $$R_i^+ \text{ and } R_i^- = 0$$

As a result, the resistance at the input to the device 650 is maintained low, even if the loop gain decreases or is reduced. This provides a stable, linear platform that is not frequency dependent or dependent on the value of $R_L$, such as for gain control. In one embodiment, the device 650 may comprise a trans-impedance device. In one embodiment, the device 650 may comprise a trans-resistance device.

Use of the method and apparatus described herein provides the advantages of low current consumption and eliminates current sources in the mixer stage thereby eliminating flicker noise. In addition, a mixer or mixer output stage as described herein has the capability for close to or at least rail to rail voltage swings at the amplifier output, such as device 430 or device 504. This provides for greater mixer conversion gain and prevents non-linearity caused by clipping or insufficient headroom.

Another advantage of this configuration is that the capacitors 432A, 432B shown in FIGS. 4 and 5 may be made smaller, or have a smaller value, for a given cut-off frequency. This is desirable because capacitor value is directly related to capacitor size and, in an integrated circuit solution, capacitors consume a substantial amount of space in relation to other devices. As a result, reductions in capacitor value result in significant size reductions for the integrated circuit. In addition, use of one or more capacitors, or other frequency dependent elements, results in a reduction in voltage swing for blocker signals, without interfering with mixer operation or affecting the virtual ground.

Figure 7:
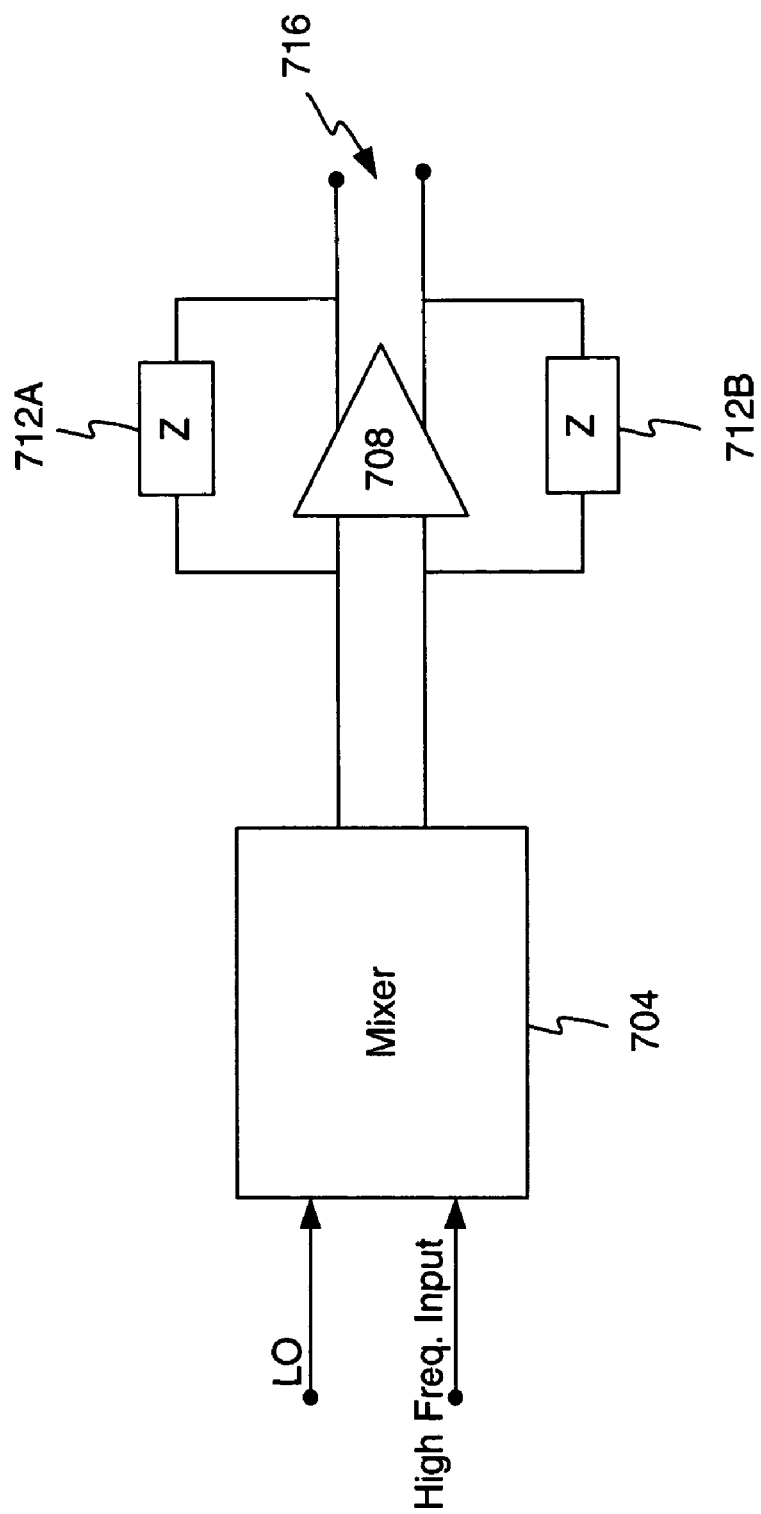
FIG. 7 illustrates a block diagram of an example generalized embodiment of the system disclosed herein.

FIG. 7 illustrates a block diagram of an example, generalized embodiment of the system disclosed herein. This is but one possible generalized embodiment having a mixer with an output stage. One of ordinary skill in the art may arrive at other embodiments that do not depart from the claims. In this embodiment a mixer 704 receives a high frequency input signal and a local oscillator signal (LO). In one embodiment, the mixer is configured to de-modulate the high frequency signal to a desired frequency, such as baseband or an intermediate frequency, and the LO signal may be at the desired frequency or the intermediate frequency. The mixer 704 processes the signal, as is generally understood, and outputs a mixer output to an output stage. In this embodiment, the output stage comprises an amplifier 708 with a first and second feedback loop. The first feedback loop comprises impedance 712A and the second feedback loop comprises impedance 712B. The impedances 712A, and 712B may comprise any level or type of impedance, such as but not limited to direct connection, capacitors, resistors, inductors, or any active or passive element. The impedances 712A, 712B may be generally identical or different in value. An amplifier 708 receives the output from mixer 704. Amplifier 708 may comprise any type gain, buffer, or amplifier device to realize at least some of the benefits described above. The amplifier 708 may have positive, negative, or unity gain. The amplifier 708 may output a voltage signal or a current signal. In one embodiment, the output 716 of the mixer output stage carries or provides the mixer output signal or mixer output stage output signal. The output signal may be at an intermediate frequency, in the case of a super heterodyne receiver or at baseband for a direct conversion receiver.

While various embodiments of the invention have been described, it will be apparent to those of ordinary skill in the art that many more embodiments and implementations are possible that are within the scope of this invention.

What is claimed is:

1. A mixer comprising:
 a first input configured to receive a local oscillator signal;
 a second input configured to receive a high frequency input;
 a mixer core configured to receive the local oscillator signal and the high frequency input to create a mixer output;
 an output stage comprising:
  at least one amplifier having an amplifier input node configured to receive the mixer output and generate an amplifier output at an amplifier output node; and
  at least one feedback path connected to the amplifier output node and the amplifier input node;
  wherein the amplifier and the at least one feedback path are configured to establish a virtual ground at the amplifier input node.

2. The mixer of claim 1, wherein the amplifier comprises an operational amplifier.

3. The mixer of claim 1, wherein the amplifier comprises a trans-conductance device.

4. The mixer of claim 1, wherein the at least one feedback path comprises an element selected from the group of elements consisting of an interconnection conductor, a capacitor and a resistor.

5. The mixer of claim 1, wherein the mixer core is biased through a load resistor, and the gain of mixer is not dependent on the value of the load resistor.

6. The mixer of claim 1, wherein the amplifier comprises an inverting differential amplifier having positive and negative input terminals and positive and negative output terminals.

7. A mixer output stage comprising:
 a positive input connected to gain device;
 a negative input connected to the gain device;
 a gain device configured to receive and process a mixer core output signal to generate a processed version of the mixer core output, the gain device further having a positive output terminal and a negative output;
 a first feedback loop connected to the positive input and the negative output and having at least one resistive element; and
 a second feedback loop connected to the negative input and the positive output and having at least one resistive element;
 wherein the mixer output stage is configured to establish a virtual ground at the positive input and the negative input for certain frequencies.

8. The mixer output stage of claim 7, wherein the gain device comprises a trans-impedance device.

9. The mixer output stage of claim 7, wherein the gain device comprises a trans-resistance device.

10. The mixer output stage of claim 7, further comprising a first capacitor in parallel with the first feedback loop and a second capacitor in parallel with the second feedback loop.

11. The mixer output stage of claim 7, wherein the positive input and the negative input comprise a virtual ground for all input frequencies.

12. The mixer output stage of claim 7, wherein the mixer output stage receives its input from a mixer and the gain of the mixer and output stage is not dependent on the mixer.

13. A method for converting a received high frequency signal to baseband frequency signal or an intermediate frequency signal comprising:
 receiving a high frequency signal;
 receiving a local oscillator signal;
 processing the high frequency signal and the local oscillator signal in a mixer to generate a processed signal;
 receiving the processed signal, or a signal related to the processed signal, at an amplifier input;
 amplifying the processed signal or a signal related to the processed signal to create an amplified signal;
 generating a feedback signal based on the amplified signal; and
 providing the feedback signal to the amplifier input to thereby maintain a virtual ground at the amplifier input.

14. The method of claim 13, wherein the processed signal is at baseband frequency or intermediate frequency.

15. The method of claim 13, wherein the amplifier comprises a trans-impedance device.

16. The method of claim 13, wherein the amplifier comprises an operational amplifier.

17. The method of claim 13, wherein the amplifier has a gain that is independent of the mixer configuration.

18. The method of claim 13, wherein the feedback signal is generated in a first feedback loop and a second feedback loop.

19. The method of claim 13, wherein the virtual ground maintains linearity of the mixer.

20. The method of claim 13, wherein processing the high frequency signal and the local oscillator signal in a mixer to generate a processed signal comprises a multiplication of the high frequency signal and the local oscillator signal.

* * * * *